(12) United States Patent
Avci et al.

(10) Patent No.: US 10,720,504 B2
(45) Date of Patent: Jul. 21, 2020

(54) TRANSISTOR WITH DYNAMIC THRESHOLD VOLTAGE FOR LOW-LEAKAGE STANDBY AND HIGH SPEED ACTIVE MODE

(71) Applicant: Intel Corporation, Santa Clara, CA (US)

(72) Inventors: Uygar E. Avci, Portland, OR (US); Daniel H. Morris, Hillsboro, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 124 days.

(21) Appl. No.: 15/751,104

(22) PCT Filed: Sep. 11, 2015

(86) PCT No.: PCT/US2015/049759
§ 371 (c)(1),
(2) Date: Feb. 7, 2018

(87) PCT Pub. No.: WO2017/044127
PCT Pub. Date: Mar. 16, 2017

(65) Prior Publication Data
US 2019/0334010 A1  Oct. 31, 2019

(51) Int. Cl.
*H01L 29/51* (2006.01)
*H01L 29/78* (2006.01)
(Continued)

(52) U.S. Cl.
CPC ...... *H01L 29/516* (2013.01); *H01L 27/11585* (2013.01); *H01L 29/6684* (2013.01); *H01L 29/78391* (2014.09)

(58) Field of Classification Search
CPC ............ H01L 29/516; H01L 29/78391; H01L 29/6684
See application file for complete search history.

(56) References Cited

U.S. PATENT DOCUMENTS

| | | | | |
|---|---|---|---|---|
| 6,515,889 B1 * | 2/2003 | Salling | ............... | G11C 11/22 365/145 |
| 2002/0196655 A1 * | 12/2002 | Salling | ............... | G11C 11/22 365/145 |

(Continued)

OTHER PUBLICATIONS

International Search Report and Written Opinion for International Patent Application No. PCT/US15/49759, dated Feb. 26, 2016.

(Continued)

*Primary Examiner* — Douglas M Menz
(74) *Attorney, Agent, or Firm* — Green, Howard & Mughal LLP

(57) ABSTRACT

Described is an apparatus which comprises a transistor including: a layer of ferroelectric material; a layer of insulating material; and an oxide layer or a metal layer sandwiched between the layer of ferroelectric material and the layer of insulating material, wherein thickness of the ferroelectric material is less than thickness of the layer of insulating material; and a driver coupled to the transistor. Described is an apparatus which comprises: a transistor including: a first oxide layer of High-K material; a second oxide layer; and a layer of nanocrystals sandwiched between the first and second oxide layers, wherein thickness of first oxide layer is greater than thickness of the second oxide layer; and a driver coupled to the transistor.

20 Claims, 10 Drawing Sheets

(51) Int. Cl.
   *H01L 27/11585*   (2017.01)
   *H01L 29/66*      (2006.01)

(56) References Cited

U.S. PATENT DOCUMENTS

| | | |
|---|---|---|
| 2004/0041180 A1 | 3/2004 | Dimmler et al. |
| 2004/0256662 A1* | 12/2004 | Black ............... B82Y 10/00 |
| | | 257/317 |
| 2008/0116530 A1 | 5/2008 | Hyun et al. |
| 2011/0199815 A1 | 8/2011 | Meade et al. |
| 2013/0062684 A1 | 3/2013 | Ding et al. |
| 2014/0254276 A1* | 9/2014 | Tokuhira ............. G11C 11/22 |
| | | 365/185.17 |
| 2014/0264438 A1 | 9/2014 | Holland et al. |

OTHER PUBLICATIONS

International Preliminary Report on Patentability for International Patent Application No. PCT/US15/49759, dated Mar. 22, 2018.

* cited by examiner

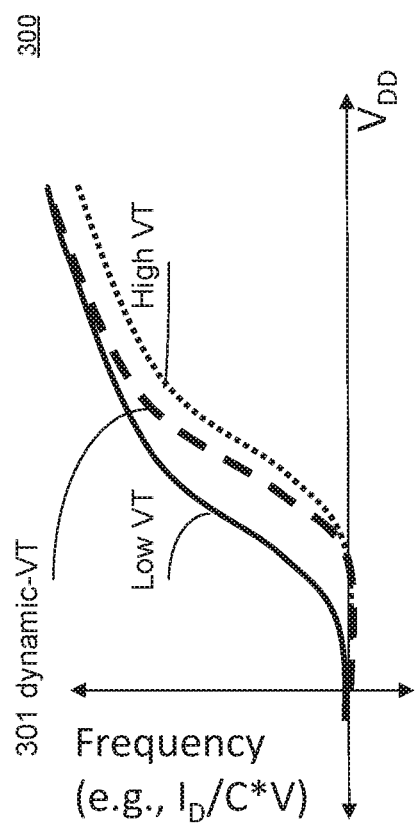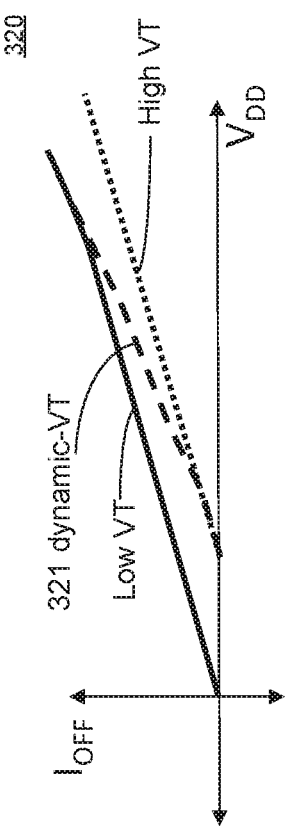
Fig. 3A
Fig. 3B

TRANSISTOR WITH DYNAMIC THRESHOLD VOLTAGE FOR LOW-LEAKAGE STANDBY AND HIGH SPEED ACTIVE MODE

CLAIM OF PRIORITY

This Application is a National Stage Entry of, and claims priority to, PCT Application No. PCT/US15/49759, filed on 11 Sep. 2015 and titled "TRANSISTOR WITH DYNAMIC THRESHOLD VOLTAGE FOR LOW-LEAKAGE STANDBY AND HIGH SPEED ACTIVE MODE," which is incorporated by reference in its entirety for all purposes.

BACKGROUND

Supply voltage (VDD) and threshold-voltage (VT) have to be co-optimized to minimize the switching and leakage power in a processor. This co-optimization depends on both the application performance requirements and the circuits' switching activity factor. However, with power management techniques of dynamic voltage-frequency scaling and clock-gating becoming popular, a basic VDD-VT optimization procedure is not possible since they need to use the same hardware (i.e., same VT) but may have very different performance requirements and different activity factors.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 3A-B illustrate a frequency vs. voltage plot and $I_{OFF}$ vs. voltage plot, respectively, for a dynamic-VT transistor, according to some embodiments of the disclosure.

DETAILED DESCRIPTION

The power management technique of frequency-voltage scaling uses clock frequency and supply voltage to adjust chip performance and power consumption to workload requirements and thermal budgets. The clock frequency achievable at a supply voltage (VDD) arises from Metal Oxide Semiconductor Field Effect Transistor (MOSFET) Current-Voltage (I-V) characteristics including voltage threshold (VT) and drive current strength (Idsat). Leakage power consumption is strongly related to VT, and VDD while switching power consumption is strongly related to $VDD^2$ and the designer's ability to clock gate circuits and reduce switching activity during periods of low activity.

Figure 1A:
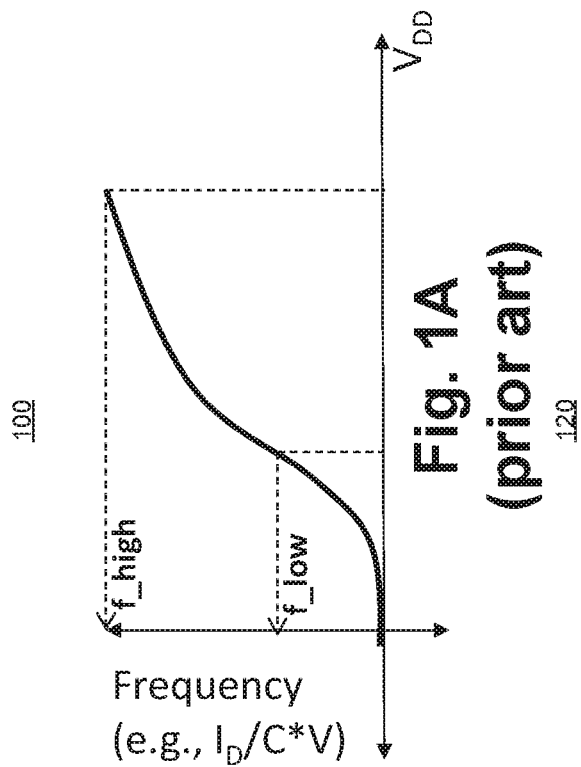
FIGS. 1A-B illustrate frequency vs. voltage trade-off and the associated increase in leakage current.
Figure 1B:
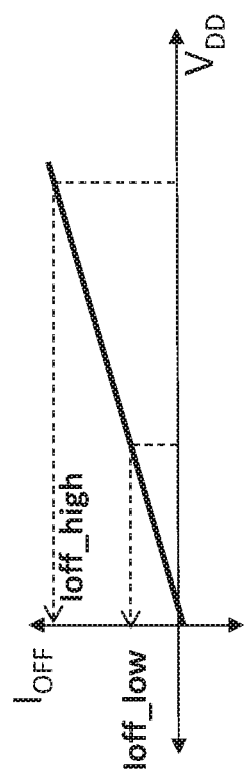

FIGS. 1A-B illustrate plots 100 and 120, respectively, showing frequency versus voltage trade-off and the associated increase in leakage current. Plot 100 shows that as VDD increases, frequency increases (e.g., from f_low to f_high) allowing the device to operate faster. Plot 120 shows that as VDD increases, the $I_{OFF}$ current (i.e., the standby or leakage current) for a turned off device increases from Ioff_low to Ioff_high.

Figure 2A:
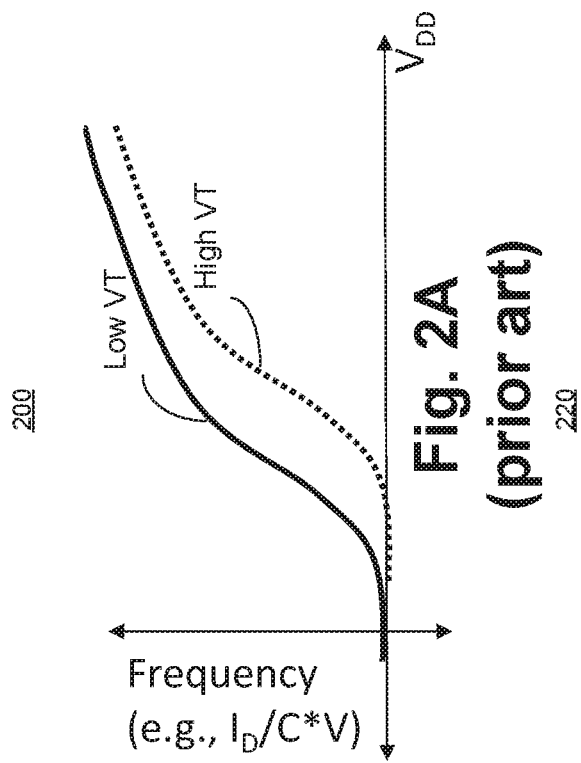
FIGS. 2A-B illustrate how different Metal Oxide Semiconductor Field Effect Transistors (MOSFETs) thresholds (VTs) present different trade-offs between leakage and switching power.
Figure 2B:
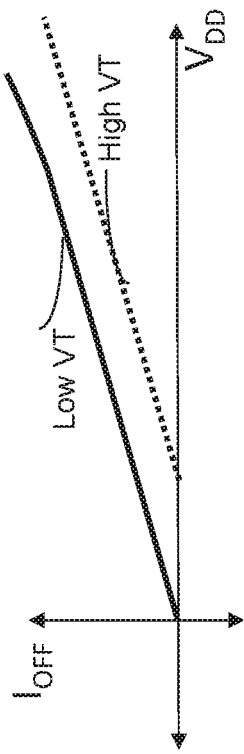

FIGS. 2A-B illustrate plots 200 and 220, respectively, showing frequency versus voltage trade-off and the associated increase in leakage current for high-VT and low-VT Metal Oxide Semiconductor Field Effect Transistors (MOSFETs). Here, the dotted curve represents the high-VT MOSFET while the solid curve represents the low-VT MOSFET. Plot 200 shows that as VDD increases, the frequency for low-VT MOSFET increases more than the frequency for high-VT MOSFET (i.e., high-VT MOSFET is slower than the low-VT MOSFET). Plot 220 shows that as VDD increases, $I_{OFF}$ current (i.e., the standby or leakage current) for a turned off MOSFET is higher for the low-VT MOSFET than for the high-VT MOSFET. A conventional MOSFET device cannot achieve as good performance (i.e., higher frequency) of the low-VT MOSFET and as good leakage performance (i.e., lower leakage) as the high-VT MOSFET.

Table 1 shows how frequency-voltage scaling is applied in a conventional design.

TABLE 1

|  | Efficient Mode | Turbo Mode |
|---|---|---|
| VT | Fixed at fabrication time | |
| VDD | Low | High |
| Frequency | Low | High |
| Switching Power Percent of Total Power | Lower | Higher |
| Leakage Power Percent of Total Power | Higher | Lower |
| Clock Gating Opportunity | Moderate | Low |
| Power Gating Opportunity | Limited due to entry/exit latencies | |

Here, two modes are shown—Efficient Mode and Turbo mode. In a conventional design, VT is fixed at the time of fabrication.

In Efficiency Mode (e.g., a low-voltage mode), the processor can be operated at low VDD which translates to low frequency (as shown in FIGS. 1A-B). In Efficiency Mode, the leakage power becomes more significant due to lower frequency operation and because of the application of clock-gating. Here, clock-gating refers to a process by which clock signal propagation is gated or halted to reduce switching activity of downstream logic which relies on the clock signal. Higher clock gating means more devices being in an inactive state which means higher leakage power relative to active power. However on the other hand, power gating may not achieve much power savings because of the slow entry/exit times due to the low clock frequency operation, (i.e., high entry/exit latencies due to overhead switching between power-gated and non-power-gated states). Here, power gating generally refers to cutting off or reducing power supply to logic/circuits to reduce power.

In Turbo Mode (e.g., high frequency mode), compared to the Efficiency Mode, the processor can be operated at higher frequency because the power supply VDD is increased. As such, switching power is a more dominant source of power consumption in Turbo Mode because of higher frequency operation and less clock gating.

Other technical effects will be evident from various embodiments described here.

Table 2 illustrates a conventional trade-off with clock gating or frequency-only scaling.

TABLE 2

|  | Clock-Gated Mode | Normal Operation |
|---|---|---|
| VT | Fixed at Fabrication Time | |
| VDD | Fixed due to VMIN, shared power rail or non-programmable supply | |
| Frequency | Minimal intermittent activity | Moderate |
| Switching Power Percent of Total Power | Lower | Higher |
| Leakage Power Percent of Total Power | Higher | Lower |

Here, two modes are shown—Clock-Gated Mode and Normal Operation. In a conventional design, VT is fixed at the time of fabrication. In the Clock-Gated Mode, the clock signal switching operation is halted which reduces switching power of the processor and the effective frequency of operation. As more devices become inactive (e.g., because the clock signal to these devices is not switching), leakage power increases.

In Normal Operation (i.e., when clock signals are switching), switching power increases because devices are reacting to switching clock signal while the percentage of leakage power reduces because devices are more active (i.e., not in an off state). Table 2 further details operation in the low voltage mode and is also descriptive of designs that are not able to scale voltage in response to workload changes and instead only adjust clocking. This may be the case in low cost platforms without programmable supplies, in designs where multiple unrelated functional blocks share a supply rail, or in low voltage designs already operating at the minimum supply voltage (VMIN). Here, VMIN refers to the lowest power supply level that keeps the circuits/logic operational (e.g., lowest power supply voltage level at which memory still retains its data).

From FIGS. 1A-B, FIGS. 2A-B, and Tables 1-2, with fixed VT, VDD adjustments provide a means to trade-off power and performance. But maximum frequency of a conventional MOSFET circuit is limited based on VMAX and the VT determined during fabrication. Here, VMAX refers to a maximum allowable power supply level for a process node which does not cause reliability issues for a predetermined period of time. Adjusting VDD alone does not reduce leakage power as significantly as would fabrication of high-VT transistor. There is a need to optimize performance, switching power, and leakage power across a wide range of workload characteristics that is not met by conventional technology having fixed VT.

Some embodiments describe a transistor with dynamic-VT. In some embodiments, the dynamic-VT transistor shifts its VT to a lower VT or higher VT automatically when more performance or energy efficiency is required. In some embodiments, the process of shifting VT works in tandem with common power management techniques of clock-gating and voltage scaling (or power scaling). As such, better trade-off between performance, switching power, and leakage power across various workload conditions is achieved by the various embodiments. Other technical effects will be evident from various embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), dynamic-VT FeFETs, dynamic-VT nanocrystal based FETs, or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIGS. 3A-B illustrate a frequency versus voltage plot 300 and Ioff vs. voltage plot 320, respectively, for a dynamic-VT transistor, according to some embodiments of the disclosure. It is pointed out that those elements of FIGS. 3A-B having the same reference numbers (or names) as the elements of any other figure can operate or function in any manner similar to that described, but are not limited to such. FIGS. 3A-B are similar to FIGS. 2A-B but for an additional curve that shows the characteristics of the dynamic-VT FET according to some embodiments.

In some embodiments, unlike back-gate or body-biased devices, the dynamic-VT FET is compatible with Tri-Gate and nanowire devices and does the VT shifting automatically. As such, no dual independent gate control is required in accordance with some embodiments. In some embodiments, the dynamic-VT FET is used in conjunction with existing power management techniques of clock-gating, power-gating, and voltage-frequency scaling. Depending on the needs for the computing system, it is useful to either shut down some parts of the chip (i.e., power-gating and clock-gating) or slow it down by lowering the supply voltage in order to reduce power consumption. This system operation happens when the electronic part will not be used for some time, and power savings is key for battery lifetime. With the addition of the dynamic-VT device, additional performance is achieved in the Turbo Mode and additional leakage saving is achieved in the clock-gated mode, in accordance with some embodiments.

In plot 300, the dynamic-VT behavior is shown by curve 301 while in plot 320 the dynamic behavior is shown by curve 321. In some embodiments, during high performance operation (e.g., Turbo Mode), the dynamic-VT FET configures its VT to be low VT. In some embodiments, during low power operation (e.g., Efficient Mode), the dynamic-VT FET configures its VT to be high VT. In some embodiments, to achieve Turbo Mode performance with low leakage of Efficient Mode, the dynamic-VT FET configures its VT such that it follows the characteristics of curves 301 and 321 automatically.

Table 3 illustrates frequency-voltage scaling with dynamic-VT FETs.

TABLE 3

|  | Efficient Mode | Turbo Mode |
| --- | --- | --- |
| VT | Dynamic High VT | Dynamic Low VT |
| VDD | Low | Reduced b/c dynamic VT enables use of lower VMAX with same performance |
| Frequency | Lower | Improved by lower dynamic VT |
| Switching Power Percent of Total Power | Lower | Reduced by lower VMAX |
| Leakage Power Percent of Total Power | Reduced by higher VT | Lower |

Compared to Table 2, which provides the frequency-voltage scaling for fixed VT conventional FETs, here in Table 3 VT is dynamically adjusted within the FET according to the activity factor of the input signal at the gate terminal of the FET. For example, when the gate terminal of the dynamic-VT FET is DC (i.e., the frequency is low or zero) for a predetermined amount of time (which depends on fabrication factors), the VT of the dynamic-VT FET begins to rise towards the high VT level. In some embodiments, when the gate terminal of the dynamic-VT FET receives a switching signal (i.e., the frequency is high), the VT of the dynamic-VT FET begins to fall towards the low VT level.

In some embodiments, in Efficient Mode, compared to Turbo Mode, the VDD and frequency are lower which cause the switching power to be a smaller percentage of the total power. Because the switching frequency of the dynamic-VT FET is low for a certain amount of time, the VT rises towards high VT and so the leakage power reduces and becomes a smaller percentage of the total power.

In some embodiments, in Turbo Mode, compared to Efficient Mode, because of high switching frequency of the dynamic-VT FET, the VT of the dynamic-VT FET lowers towards the low VT level. As such, the low VT caused by the dynamic-VT FET enables the use of lower VMAX (i.e., maximum allowable operating supply voltage of the processor without causing reliability issues) with the same performance. In some embodiments, the frequency in Turbo Mode can be increased (i.e., improved) for higher processing while the power envelope remains unchanged because VDD has lowered. As such, overall switching power as a percentage of total power is reduced by the lowered VMAX. In Turbo Mode, leakage power is generally not that important because the transistors are switching frequently and are not in standby.

Table 4 illustrates clock-gating or frequency-gating scaling with dynamic-VT FETs.

TABLE 4

|  | Clock-Gated Mode | Normal Operation |
| --- | --- | --- |
| VT | Dynamic High-VT | Dynamic Low-VT |
| VDD | Fixed due to VMIN, shared power rail or non-programmable supply | |
| Frequency | Minimal intermittent activity | Moderate |

TABLE 4-continued

| | Clock-Gated Mode | Normal Operation |
|---|---|---|
| Switching Power Percent of Total Power | Lower | Higher |
| Leakage Power Percent of Total Power | Reduced by transistors higher VT | Lower |

Compared to Table 2, which provides the clock-gating or frequency-gating scaling for fixed VT conventional FETs, here, as illustrated by Table 4, VT is dynamically adjusted within the FET according to the activity factor of the input signal at the gate terminal of the FET. For example, when the clock signal is gated (i.e., Clock-Gated Mode), switching activity of the devices is reduced and so the gate terminal of the dynamic-VT FET is DC or near DC (i.e., the frequency or activity factor is low or zero). In one such embodiment, the VT of the dynamic-VT FET begins to rise towards the high VT level after the DC input remains applied for a predetermined amount of time. In some embodiments, during normal operation (i.e., when the clock is freely oscillating and is not gated) the gate terminal of the dynamic-VT FET receives a switching signal (i.e., the frequency is high which means a higher activity factor). In one such embodiment, the VT of the dynamic-VT FET begins to fall towards the low VT level.

In this example, VDD is fixed due to VMIN (e.g., because power rail is shared or non-programmable, VDD is fixed). During clock-gating, the frequency is minimal and the switching power is a small percentage of the total power. Since the VT of the dynamic-VT FET rises towards high VT during clock-gating mode, leakage power as a percentage of total power reduces (because higher VT devices have less leakage). Compared to the normal operation, switching power is a higher percentage of total power because the clock is not gated (which is why the row "Frequency" is labeled as Moderate). In the normal mode, leakage power is generally not that important because the transistors are switching frequently and are not in standby.

Figures 4A, 4B:
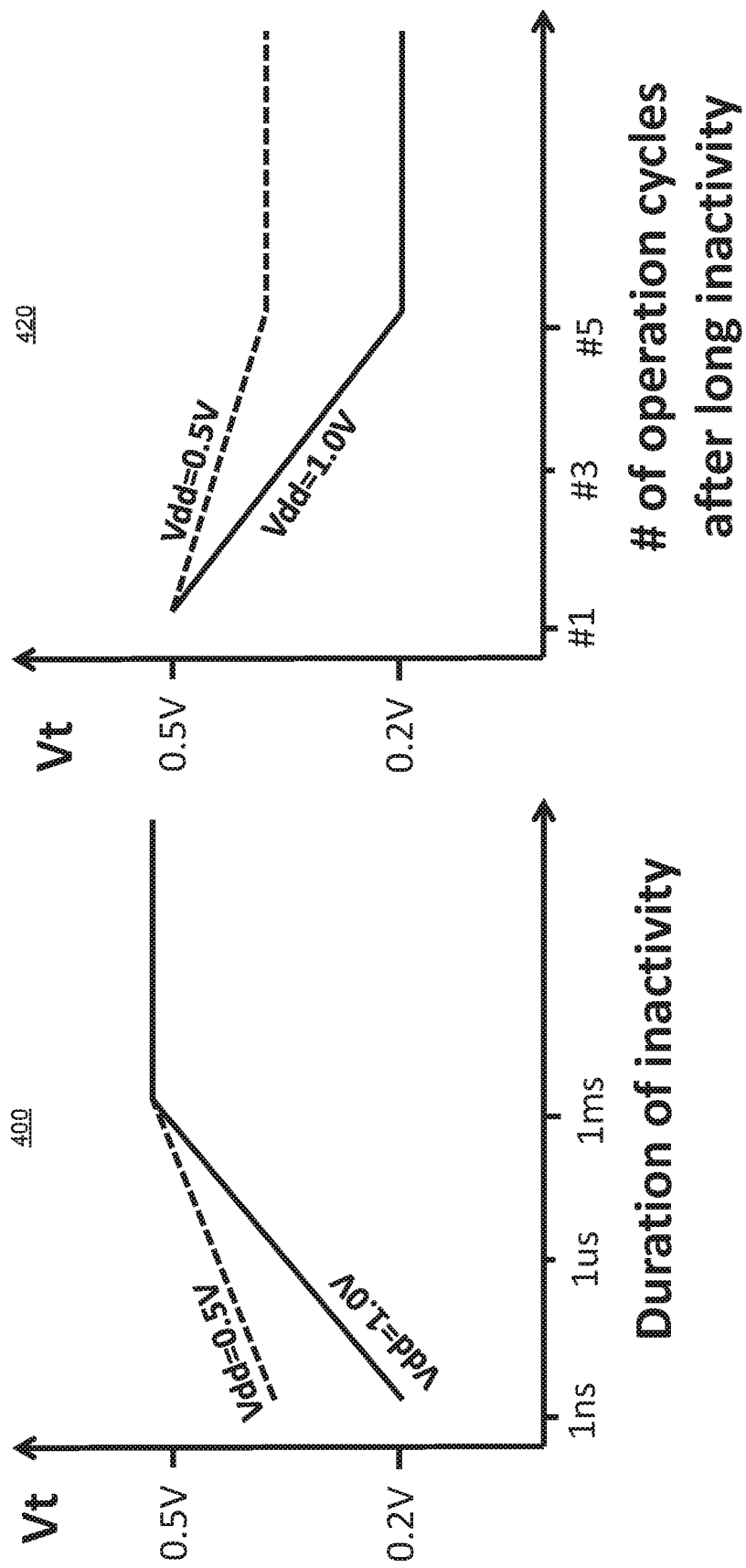
FIGS. 4A-B illustrate plots showing asymmetric and VDD dependent VT of the dynamic-VT transistor, according to some embodiments of the disclosure.

FIGS. 4A-B illustrate plots 400 and 420, respectively, showing asymmetric and VDD dependent VT of the dynamic-VT FET, according to some embodiments of the disclosure. It is pointed out that those elements of FIGS. 4A-B having the same reference numbers (or names) as the elements of any other figure can operate or function in any manner similar to that described, but are not limited to such.

In some embodiments, an asymmetry is provided by the dynamic-VT FET in the time that it takes to shift to low and high VTs. For conventional FETs, the writing of a 0 and 1 is symmetric (i.e., the two operations of writing takes the same time to complete). However, in dynamic-VT FET, there is an asymmetry. In some embodiments, the dynamic-VT FET is designed such that the shift to low VT happens quickly enough so that the circuit can "wake-up" and achieve maximum performance quickly. In some embodiments, the dynamic-VT FET is also designed such that the shift to high VT happens more slowly to minimize or reduce the number of gates that inadvertently enter the slower, lower leakage state. In some embodiments, the dynamic-VT FET is also designed such that there is not a significant penalty for taking a long time to shift to a high VT state as leakage power is merely significant when it occurs over a long period of time.

Here, plot 400 shows two curves for different VDD levels (e.g., 0.5V and 1.0V). In some embodiments, during times of less inactivity (i.e., higher activity), the dynamic-VT FET reduces its VT. In some embodiments, during times of more inactivity (in this example, after 1 ms of inactivity), the dynamic-VT FET raises its VT to high VT.

Here, plot 420 shows two curves for different VDD levels. In some embodiments, after long inactivity, as the number of operation cycles increases (i.e., as switching activity increases), the dynamic-VT FET reduces the VT towards low VT. In this example, after 5 switching cycles, the VT of the dynamic-VT FET is low VT. As such, the dynamic-VT FET allows for fast wake-up to provide instant or near instant operation from sleep mode. In some embodiments, the dynamic-VT FET allows for slow transitions to high-VT mode to avoid the processor unintentionally entering sleep state (i.e., low leakage power state).

Figure 5:
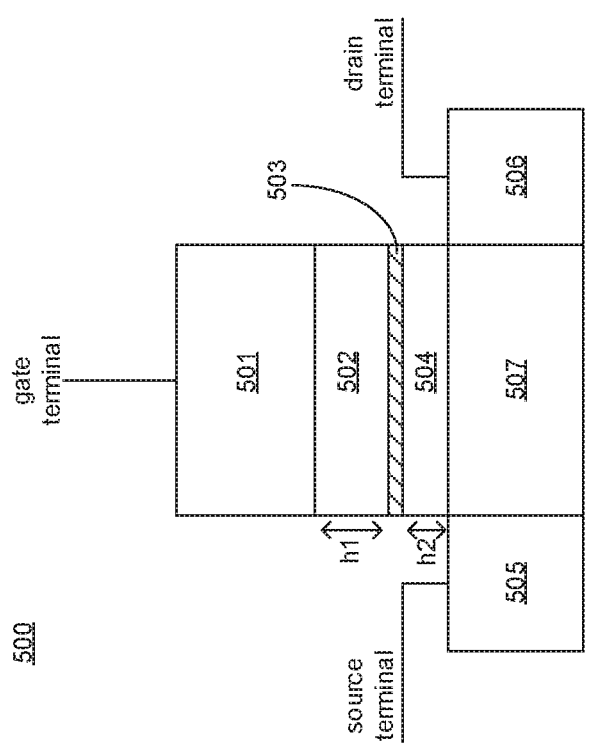
FIG. 5 illustrates a cross-section of a ferroelectric field effect transistor (FeFET) which is configured to provide dynamic-VT, according to some embodiments of the disclosure.

FIG. 5 illustrates cross-section 500 of a FeFET which is configured to provide dynamic-VT, according to some embodiments of the disclosure. It is pointed out that those elements of FIG. 5 having the same reference numbers (or names) as the elements of any other figure can operate or function in any manner similar to that described, but are not limited to such.

In some embodiments, dynamic-VT FeFET (as shown by its cross-section 500) comprises a gate material layer (e.g., metal) 501, insulator layer 502, layer of fixed charges 503, ferroelectric layer 504, source region 505, drain region 506, and channel region 507. In some embodiments, layer of fixed charges 503 is formed of any differential material. In some embodiments, layer of fixed charges 503 is a layer of oxide (e.g., $Al_2O_3$). In some embodiments, layer of fixed charges 503 is formed of a metal material (e.g., Ti or W). In some embodiments, an image from a Transmission Electron Microscope (TEM) using Energy Dispersive X-ray (EDX) spectrum analysis of the stack forming dynamic-VT FeFET 500 shows one of the layers of oxide (e.g., $Al_2O_3$), Ti, or W at the junction of the top and bottom layers that is not part of the composition of the top or bottom layer (i.e., oxide and or the ferroelectric layer 504).

In some embodiments, the dynamic-VT FeFET can have n-type or p-type source/drain doping to form either p-type or n-type devices. In some embodiments, ferroelectric layer 504 is coupled in series with insulator (oxide) layer 502 via the layer of fixed charges 503. In some embodiments, the thickness "h1" of oxide layer 502 and the thickness "h2" of ferroelectric layer 504 can be adjusted together with fixed charge density. As such, ferroelectric hysteresis curve can be shifted so that it is faster to lower VT than to increase VT and also to achieve the correct VT target.

In some embodiments, depending on how fast the input signal is received by the gate terminal switches, the movement of the VT is determined (i.e., whether the VT is moving from high VT to low VT or from low VT to high VT). The switching of ferroelectric layer 504 depends on its polarization level and the direction together with the field applied on it through the gate and channel. During dynamic operation of gates in a logic circuit, ferroelectric layer 504 may be applied different levels of electric field, in accordance with some embodiments. Depending on the current polarization of ferroelectric layer 504 and the weighted effect of the electric fields over time, ferroelectric layer 504 may change its polarization differently, in accordance with some embodiments.

Source region 505, channel region 507, and drain region 506 may be formed using any typical source, channel, and drain materials. For example, materials with a few Angstrom to 10's of nanometers thickness including but not limited to Si, Ge, SiGe, GeSn, InAs, InGaAs, GaAs, any other III-V, Graphene, MOS2, MoX2 and any other TMDs (transition metal dichalcogenide) may be used for forming source region 505, channel region 507, and drain region 506.

In some embodiments, gate material layer 501 is a gate metal with 1 to 100 nm thickness range and can be any combination of metals (e.g., Ti, TiN, W, Al, etc.) or highly doped semiconductor. In some embodiments, insulator layer 502 is a gate insulator with a few Angstrom to 10 nm thickness and may be one of: $SiO_2$, $SiO_x$, silicon oxynitride, Silicon nitride, hafnium oxide, tantalum oxide, titanium oxide, aluminum oxide, etc. In some embodiments, ferroelectric layer 504 has a thickness in the range of 1 nm to 10 nm and may be formed by one of: PZT, SRO, hafnium oxide or any other ferroelectric material and their combination.

In some embodiments, layers 502 and 504 may be switched so that ferroelectric layer 504 is positioned next to gate region 501, and insulator layer 502 is next to channel region 507 to achieve a similar device behavior.

Figure 6B:
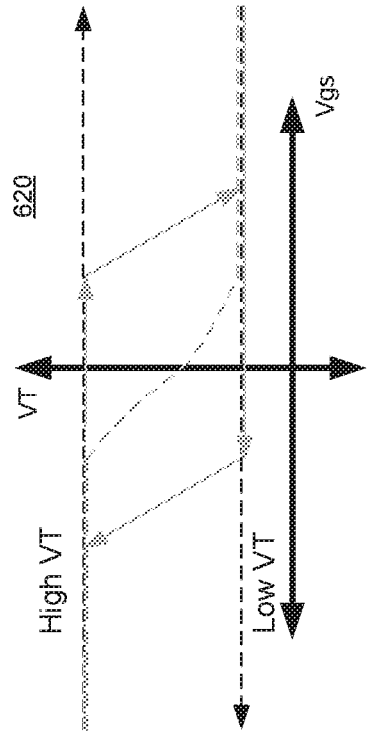
FIGS. 6A-C illustrate plots showing the memory principle of a traditional FeFET with symmetric behavior.
Figure 6A:
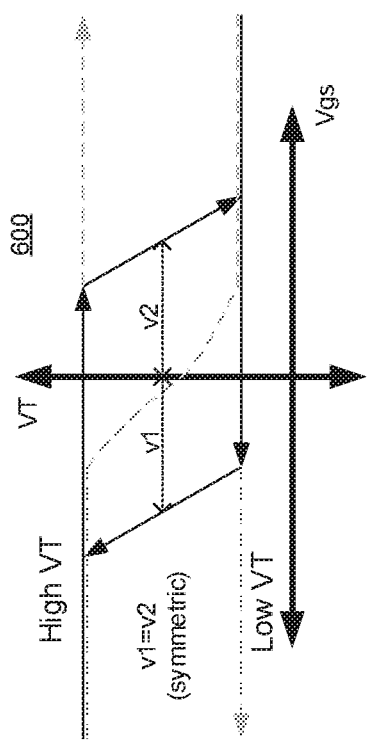
Figure 6D:
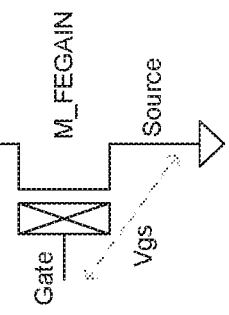
FIG. 6D illustrates a traditional FeFET to describe FIGS. 6A-C.
Figure 6C:
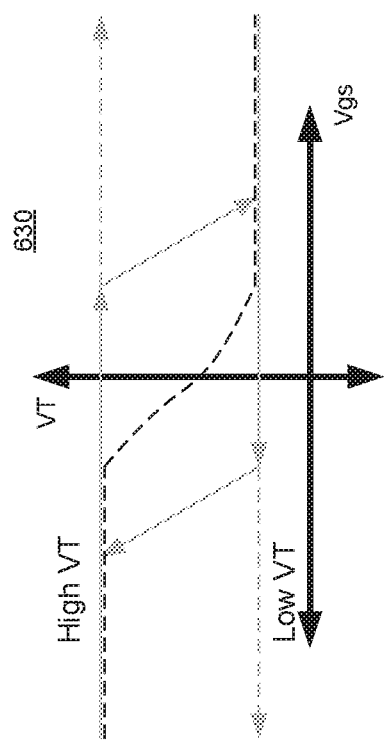

FIGS. 6A-C illustrate plots showing the memory principle of a traditional FeFET with symmetric behavior. It is pointed out that those elements of FIGS. 6A-C having the same reference numbers (or names) as the elements of any other figure can operate or function in any manner similar to that described, but are not limited to such.

FIGS. 6A-C illustrate plots 600, 620, and 630, respectively, showing the memory principle of a conventional FeFET, according to some embodiments of the disclosure. The plots are described with reference to n-type transistor M_FEGAIN (of ferroelectric (FE) Cell 640) of FIG. 6D. It is pointed out that those elements of FIGS. 6A-D having the same reference numbers (or names) as the elements of any other figure can operate or function in any manner similar to that described, but are not limited to such. Here, x-axis is Vgs of FE Cell 640 (i.e., gate to source voltage) and y-axis is the effective threshold voltage (VT) of M_FEGAIN.

Plot 600 of FIG. 6A shows FE Cell 640 exhibiting symmetric hysteresis across Vgs with reference to VT when Vgs is applied for a duration equal to or more than a minimum transition duration. Symmetric hysteresis is illustrated by v1 being equal to v2. The gray dotted line that passes between the two thresholds is the behavior of FE Cell 640 over a long period of time (e.g., infinite transition response time) when the ferroelectric material depolarizes. In some embodiments, when Vgs is applied to transistor M_FEGAIN for more than a minimum transition duration (e.g., 100 nanoseconds (ns)), the ferroelectric material is polarized so that it stores a charge according to the applied Vgs.

The term "minimum transition duration" here generally refers to a suitable duration of time during which a voltage (e.g., Vgs) is applied to a ferroelectric material to cause the ferroelectric material to be polarized and to store a charge according to the applied voltage. Minimum threshold duration also refers to a function of the amount of fixed charge and the material properties of ferroelectric layer and insulator oxide thickness. The minimum transition duration may be a predetermined value depending on the ferroelectric material stack and their thicknesses. The minimum transition duration as being 100 ns is just an example, however, this parameter should not be understood to be limiting as the minimum transition duration could be designed to be substantially shorter or longer based upon application-specific requirements. In general, longer minimum transition times can enable lower voltage operation, higher read signals, longer ferroelectric retention.

As such, depending on the Vgs, a logic 1 or logic 0 state is stored as charge polarization in the ferroelectric material when Vgs is applied for more or equal to the minimum transition duration. This charge polarization can be substantially non-volatile (i.e., it decays over a very long period of time compared to the required storage/retention time). In some cases, the non-volatility can be traded for lower voltage operation. For example, potentially the ferroelectric material could be designed to switch faster at a lower voltage but would also depolarize faster and provide shorter duration of non-volatility (e.g., 1 hour of non-volatile (NV) storage) before a refresh is needed.

The two levels of VT are High VT and Low VT. These two threshold levels indicate the two programmable storage states—logic 1 and logic 0 states. When FE Cell 640 is programmed or the FE material is polarized, a state is stored. For example, logic state 1 is stored when FE Cell 640 is programmed (by application of −Vgs) to high VT and logic state 0 is stored when FE Cell 640 is programmed (by application of +Vgs) to low VT.

When a state is stored in transistor M_FEGAIN by a programmed high VT, a subsequent intermediate Vgs application to transistor M_FEGAIN may cause transistor M_FEGAIN to remain off (because the high VT is higher than the intermediate Vgs). As such, transistor M_FEGAIN is off and the standby current path through is reduced because of the high VT. When a state is stored by a programmed low VT, a subsequent intermediate Vgs application to transistor M_FEGAIN will cause transistor M_FEGAIN to turn on (because the low VT is lower than the normal Vgs). As such, transistor M_FEGAIN is turned on. Here, the term "intermediate Vgs" generally refers to a Vgs value less than the Vgs value used to program a logic-1 state but higher than the Vgs value used to program a logic-0 state.

Plot 620 of FIG. 6B shows the behavior of FE Cell 640 when Vgs is applied to transistor M_FEGAIN for less than the minimum transition duration (e.g., less than 100 ns). In this case, the Vgs may not cause the FE material to be programmed or polarized to store a logic state because the duration of Vgs application is not long enough (i.e., not equal or more than the minimum transition duration). In some embodiments, the ferroelectric material provides a large enough gate capacitance for temporarily storing a logic state when the FE material is not programmed or polarized. When a state is stored by the gate capacitance offered by the ferroelectric material of transistor M_FEGAIN, transistor M_FEGAIN behaves similar to a normal n-type transistor. In this phase of operation, the threshold voltage of M_FEGAIN is due to its history and does not change during the operation. In some embodiments, transistor M_FEGAIN is off when the voltage or charge on its gate terminal is less than VT. In some embodiments, transistor M_FEGAIN is on when voltage or charge on its gate terminal is more than the VT.

Plot 630 of FIG. 6C shows the behavior of FE Cell 640 after passage of a long duration (i.e., infinite time response). In this case, the ferroelectric material of transistor M_FEGAIN (or FE Cell 640) depolarizes and so the distinction between high VT and low VT blurs. For example, plot 630 shows that the VT becomes in the middle of high VT and low VT which makes it difficult to distinguish between the logic 1 or logic 0 states stored in the ferroelectric material. Data in FE Cell 640 can be lost to depolarization of the FE element which occurs over a long period of time. Additionally, data can be over written by programming FE Cell 640 by the application of a Vgs. Applying a Vgs signal of insufficient magnitude or duration can result in the programming of VT level intermediate to those defined as Logic-0 or Logic-1.

Figure 7A:
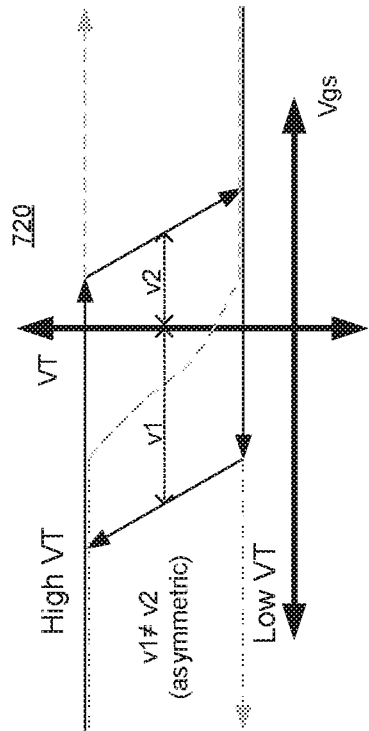
FIGS. 7A-B illustrate a plot showing the memory principle of a dynamic-VT FeFET with asymmetric behavior, according to some embodiments of the disclosure.
Figure 7B:
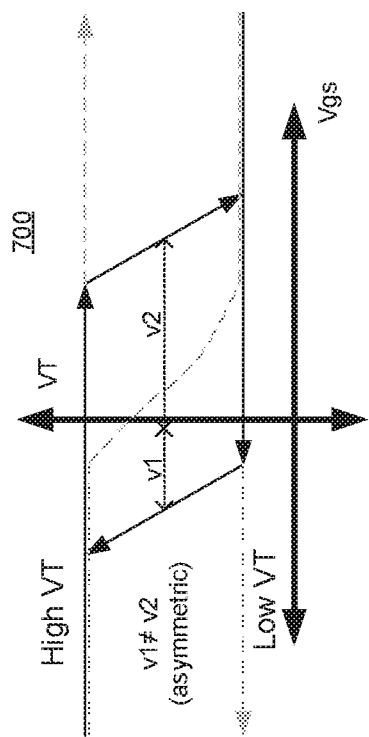

FIGS. 7A-B illustrate plots 700 and 720, respectively, showing the memory principle of a dynamic-VT FeFET with asymmetric behavior, according to some embodiments of the disclosure. It is pointed out that those elements of FIGS. 7A-B having the same reference numbers (or names) as the elements of any other figure can operate or function in any manner similar to that described, but are not limited to such. So as not to obscure the various embodiments, differences between FIGS. 7A-B and FIGS. 6A-C are described.

Compared to the symmetric hysteresis plots 600, 620, and 630 of FIGS. 6A-C (i.e., v1 is equal to v2), the hysteresis plots of FIG. 7A-B are asymmetric (i.e., v1 is not equal to v2), in accordance with some embodiments. FIG. 7A illustrates the case when v2 is greater than v1 while FIG. 7B illustrates the case when v2 is less than v1. In some embodiments, it is this asymmetry that allows for fast wake-up and slow fall asleep by the dynamic-VT FET.

Figure 8:
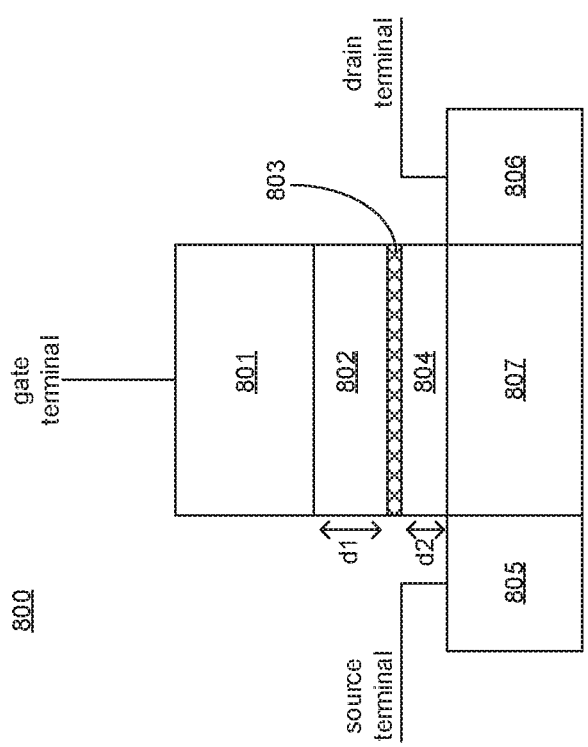
FIG. 8 illustrates a cross-section of a dynamic-VT FET with a layer of nanocrystals configured to provide dynamic-VT, according to some embodiments of the disclosure.
Figure 10A:
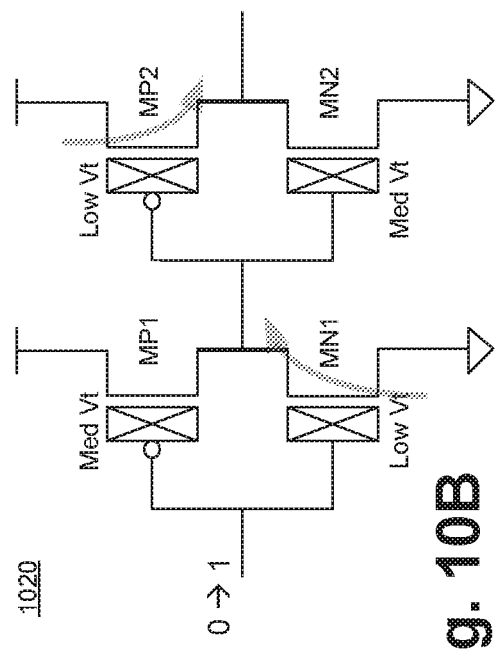
FIGS. 10A-D illustrate a sequence of dynamic-VT transitions in a buffer, formed from dynamic-VT FETs, during wake-up mode after a long period of inactivity at the input of the buffer, according to some embodiments of the disclosure.
Figure 10B:
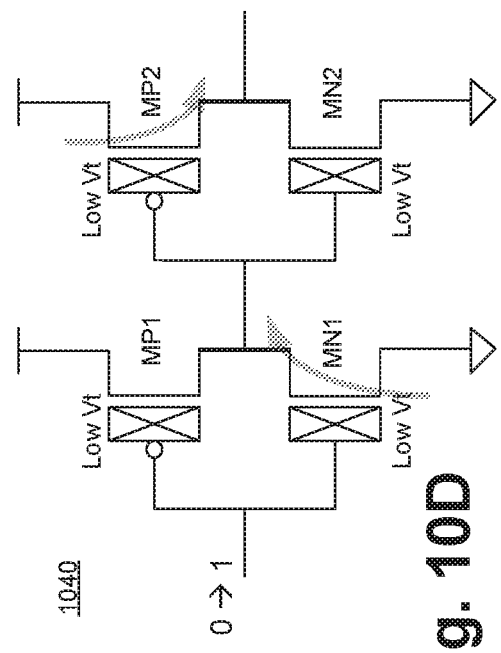
Figure 10C:
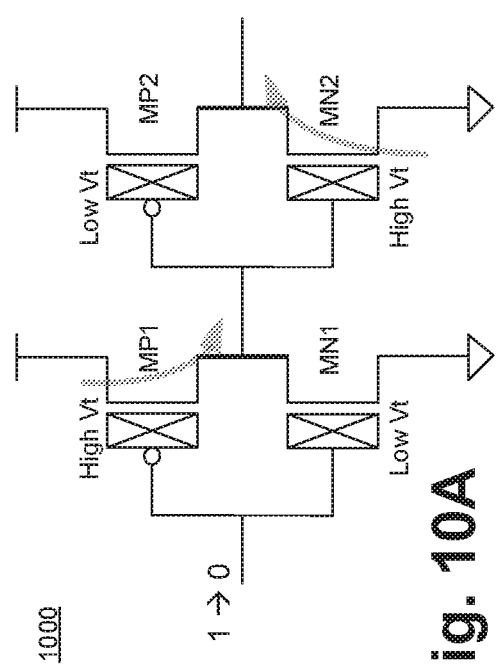
Figure 10D:
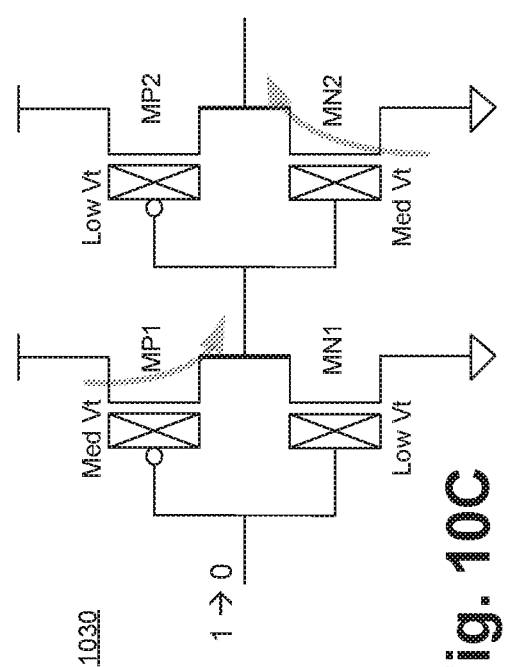

FIG. 8 illustrates cross-section 800 of a dynamic-VT FET with a layer of nanocrystals configured to provide dynamic-VT, according to some embodiments of the disclosure. It is pointed out that those elements of FIG. 8 having the same reference numbers (or names) as the elements of any other figure can operate or function in any manner similar to that described, but are not limited to such.

In some embodiments, dynamic-VT FET (as shown by its cross-section 800) comprises a gate material layer (e.g., metal) 801, oxide layer 802, layer of nanocrystals 803, layer of Silicon Dioxide 804, source region 805, drain region 806, and channel region 807. In some embodiments, the dynamic-VT FET can have n-type or p-type source drain doping to form either p-type or n-type devices. In some embodiments, the position of the layer of nanocrystals 803 is relatively closer to the interface of the layer of Silicon Dioxide 804 than from the interface of oxide layer 802 (i.e., d1 is greater than d2).

In some embodiments, oxide layer 802 is formed from High-K dielectric material. In some embodiments, the layer of nanocrystals 803 is formed from materials such as silicon nitride ($Si_3N_4$). Other materials that are similar to those used in flash memory designs of Silicon-Oxide-Nitride-Oxide-Silicon (SONOS) memory can be used for form nanocrystals 803.

In some embodiments, source region 805, channel region 807, and drain 806 may be any MOSFET material with a few Angstrom to 10's of nanometers thickness including but not limited to Si, Ge, SiGe, GeSn, InAs, InGaAs, GaAs, any other III-V, Graphene, MOS2, MoX2 and any other TMDs (transition metal dichalcogenide). In some embodiments, layer 801 is the gate metal with 1 to 100 nm thickness range and can be any combination of metals (e.g., Ti, TiN, W, Al, etc.) or highly doped semiconductor. In some embodiments, layers 802 and 804 are gate insulators with a few Angstrom to 10 nm thickness and may be one of: $SiO_2$, $SiO_x$, silicon oxynitride, Silicon nitride, hafnium oxide, tantalum oxide, titanium oxide, aluminum oxide. For asymmetric charging behavior, 804 may be thinner than 802 (e.g., 1 nm layer 804 vs. 3 nm layer 802) or bandgap of layer 804 may be larger than bandgap layer 802.

In some embodiments, the VT for the dynamic-VT FET of FIG. 8 can be adjusted by filling up or emptying the nanocrystals from layer of nanocrystals 803. In some embodiments, by designing the distance of the nanocrystals from the Gate terminal relative to channel 807, the write time for high VT can be arranged to be much longer than the erase time (which is determined by low VT).

In some embodiments, depending on how fast the input signal received by the gate terminal switches, the movement of the VT is determined (i.e., whether the VT is moving from high VT to low VT or from low VT to high VT). The movement of VT depends on the amount of charge currently stored in the crystals and the potentials at the gate and the channel. In some embodiments, more electrons in the nanocrystals of layer of nanocrystals 803 means less electrons in channel region 807, which results in high VT. In some embodiments, less electrons in the nanocrystals of layer of nanocrystals 803 means more electrons in channel region 807, which results in low VT.

P-type FET version can be accomplished in as similar way, in accordance with some embodiments. For p-type FET, in some embodiments, nanocrystals are placed at a different position and oxide layer thicknesses is different than NMOS. These changes to nanocrystal location and oxide layer thickness adjust charging/discharging of p-type transistors.

Figure 9:
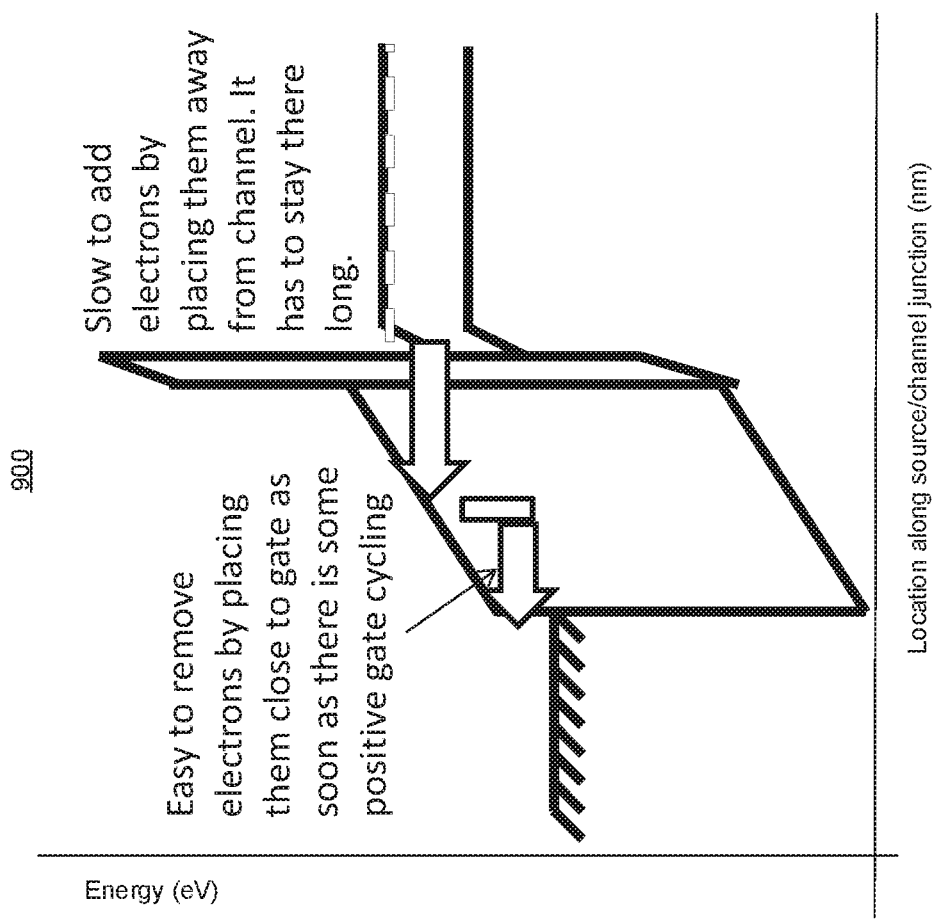
FIG. 9 illustrates a plot showing energy-level diagram for the dynamic-VT FET of FIG. 8, in accordance with some embodiments of the disclosure.

FIG. 9 illustrates plot 900 showing energy-level diagram for the dynamic-VT FET of FIG. 8, in accordance with some embodiments of the disclosure. It is pointed out that those elements of FIG. 9 having the same reference numbers (or names) as the elements of any other figure can operate or function in any manner similar to that described, but are not limited to such.

When the gate potential is positive for long periods of time or when there is a high switching activity that provides effectively high percentage of time that the gate voltage is high, the tendency of electrons are to be removed from the floating nanocrystals, lowering the VT and increasing the transistor current, thus increasing the performance. When gate potential is mostly low or channel potential is more positive, electrons will start to get into the nanocrystals and increase the VT, lowering the transistor current and thus lowering the standby power.

FIGS. 10A-D illustrate a sequence 1000, 1020, 1030, and 1040 of dynamic-VT transitions in a buffer, formed from dynamic-VT FETs, during wake-up mode after a long period of inactivity at the input of the buffer, according to some embodiments of the disclosure. It is pointed out that those elements of FIGS. 10A-D having the same reference numbers (or names) as the elements of any other figure can operate or function in any manner similar to that described, but are not limited to such.

Here, a buffer is shown made from dynamic-VT FETs such as those described with reference to FIG. 5 and FIG. 8 in accordance with some embodiments. In some embodiments, the buffer is made from dynamic-VT p-type devices MP1 and MP2 and dynamic-VT n-type devices MN1 and MN2 coupled together as shown. In this example the dynamic-VT adjustment after a very long period of inactivity is illustrated (e.g., having a logic one at the input of the buffer for a long period of time, and then switching the input to logic low). In this example, the sequence of dynamic-VT transitions are shown in four segments—1000, 1020, 1030, and 1040.

In segment 1000, in some embodiments, after the first switching event (i.e., after input signal switches from logic high to logic low), the VT of transistors MP1 and MN2 remain at high VT while transistors MN1 and MP2 remain at low VT because of the previous DC condition at the inputs of their gate terminals. The light shaded arrows show the switching transistors while the other transistors are off. Because of the VTs of the switching transistors being in high VT state, the first switching event is slow compared to the switching events in other segments.

In segment 1020, the VTs of transistors is illustrated after the second switching event (i.e., the input to the buffer switches from logic low to logic high). This switching event is much faster than that of segment 1000 because the VTs of the switching transistors MN1 and MP2 are at low VT, since NMOSFET MN1 were held at "1" and PMOSFET MP2 was held at "0" for a long period of time before segment 1000. During the second switching event, in some embodiments, the VTs of transistors MP1 and MN2 are medium VT (Med VT) because the VTs begin to transition from High VT to Low VT at segment 1000.

In segment 1030, the VTs of transistors are illustrated after the third switching event (i.e., the input of the buffer switches from logic high to logic low). Compared to the switching speed in segment 1020, the switching speed in segment 1030 is medium speed. This is because the switching transistors MP1 and MN2 have Med VT at this point (i.e., their VTs are still transitioning to Low VT from High VT).

In segment 1040, the VTs of transistors are illustrated after the fourth switching event (i.e., the inputs to the buffer switches from logic low to logic high). Compared to the switching speed in segment 1030, the switching speed in segment 1040 is of fast speed. This is because the switching transistors MN1 and MP2 have Low VT. During this segment, the VTs of the non-transitioning transistors (i.e., transistors MP1 and MN2) transitions from Med VT to Low VT. As such, in subsequent segments, the switching speeds is fast because all transistors in the buffer have now transitioned to low VT.

Figure 11:
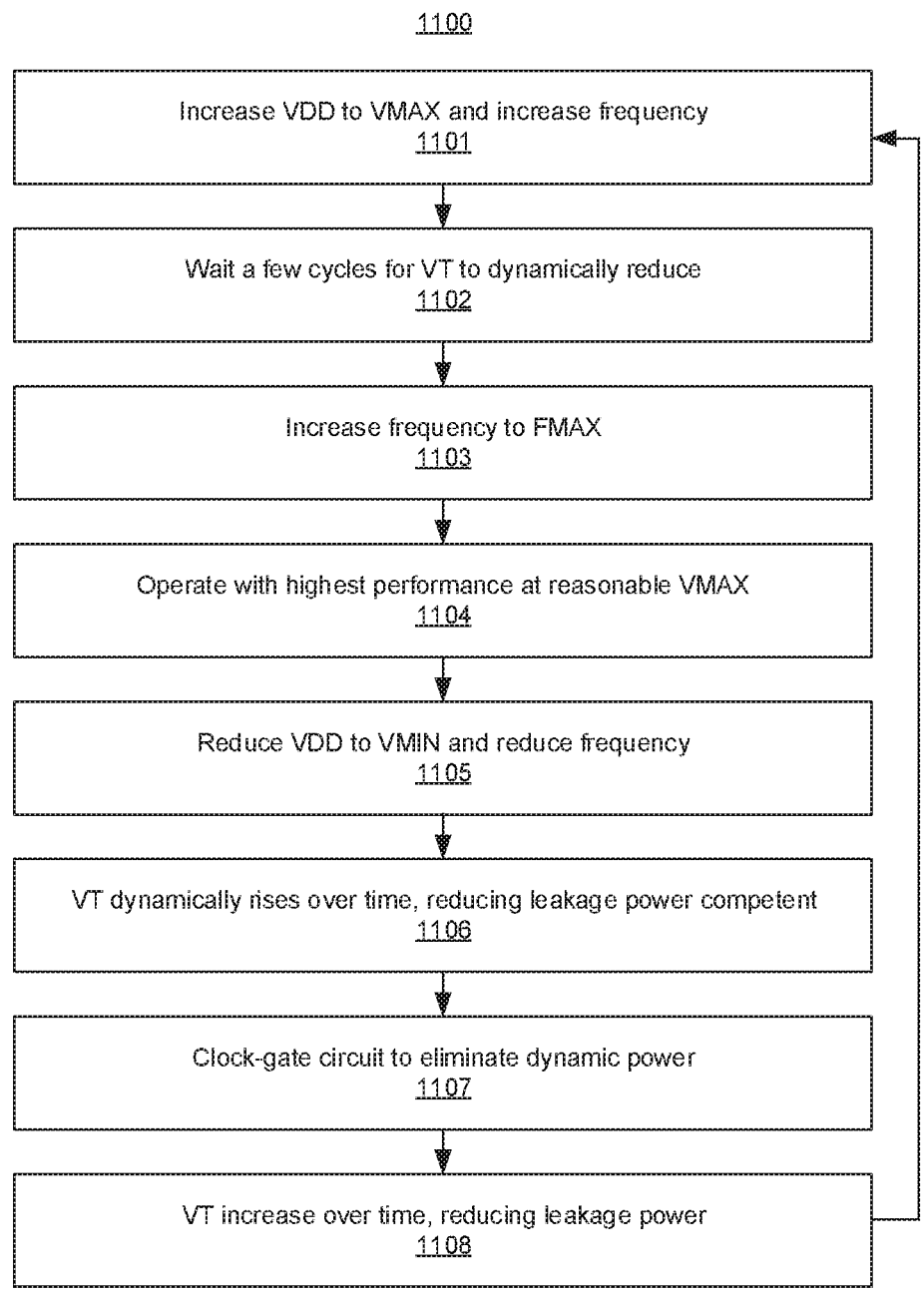
FIG. 11 illustrates a flowchart of a sequence of dynamic-VT, supply voltage, and frequency transitions in a processor formed from dynamic-VT FETs, according to some embodiments of the disclosure.

FIG. 11 illustrates flowchart 1100 of a sequence of dynamic-VT, supply voltage, and frequency transitions in a processor formed from dynamic-VT FETs, according to some embodiments of the disclosure. It is pointed out that those elements of FIG. 11 having the same reference numbers (or names) as the elements of any other figure can operate or function in any manner similar to that described, but are not limited to such.

Although the blocks in the flowchart with reference to FIG. 11 are shown in a particular order, the order of the actions can be modified. Thus, the illustrated embodiments can be performed in a different order, and some actions/blocks may be performed in parallel. Some of the blocks and/or operations listed in FIG. 11 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 1101, VDD is increased to VMAX and frequency of the processor is increased accordingly. For example, the processor enters Turbo Mode. Because of the increase in switching frequency, the dynamic-VT devices in the processor begin to transition towards lower VT to provide the expected performance in Turbo Mode. At block 1102, after waiting a few clock cycles, VT reduces to achieve the lower VT level. Since VT of the dynamic FETs are now reduced to low VT, at block 1103, the clock frequency of the processor is increased to its maximum level (i.e., FMAX). At this point, the processor is ready to operate at high speed as expected in a Turbo Mode.

At block 1104, the processor now operates with its highest performance at reasonable VMAX (e.g., in the range of approximately 1 to 1.2V) because the dynamic-VT devices have dynamically lowered their VTs. At block 1105, the processor decides to enter a low power mode. As such, VDD is reduced to VMIN to reduce frequency. To reduce leakage power caused from turned off devices, the dynamic-VT devices dynamically raise their VTs as illustrated in block 1106.

At block 1107, the processor enables clock-gating to eliminate the dynamic power. Because of the clock-gating, the switching activity at the gate terminals of the dynamic-VT devices reduces or becomes zero. As such, the dynamic-VT devices begin to raise their VT from the low VT level. At block 1108, the dynamic-VT devices continue to increase their VT from low (or medium) VT to high VT to further reduce leakage power. This process can be repeated. As such, the dynamic-VT devices improve the performance of the processor by dynamically reducing leakage in low power modes by increasing VT and by dynamically increasing switching speeds, as frequency and supply increases, by reducing VT.

Figure 12:
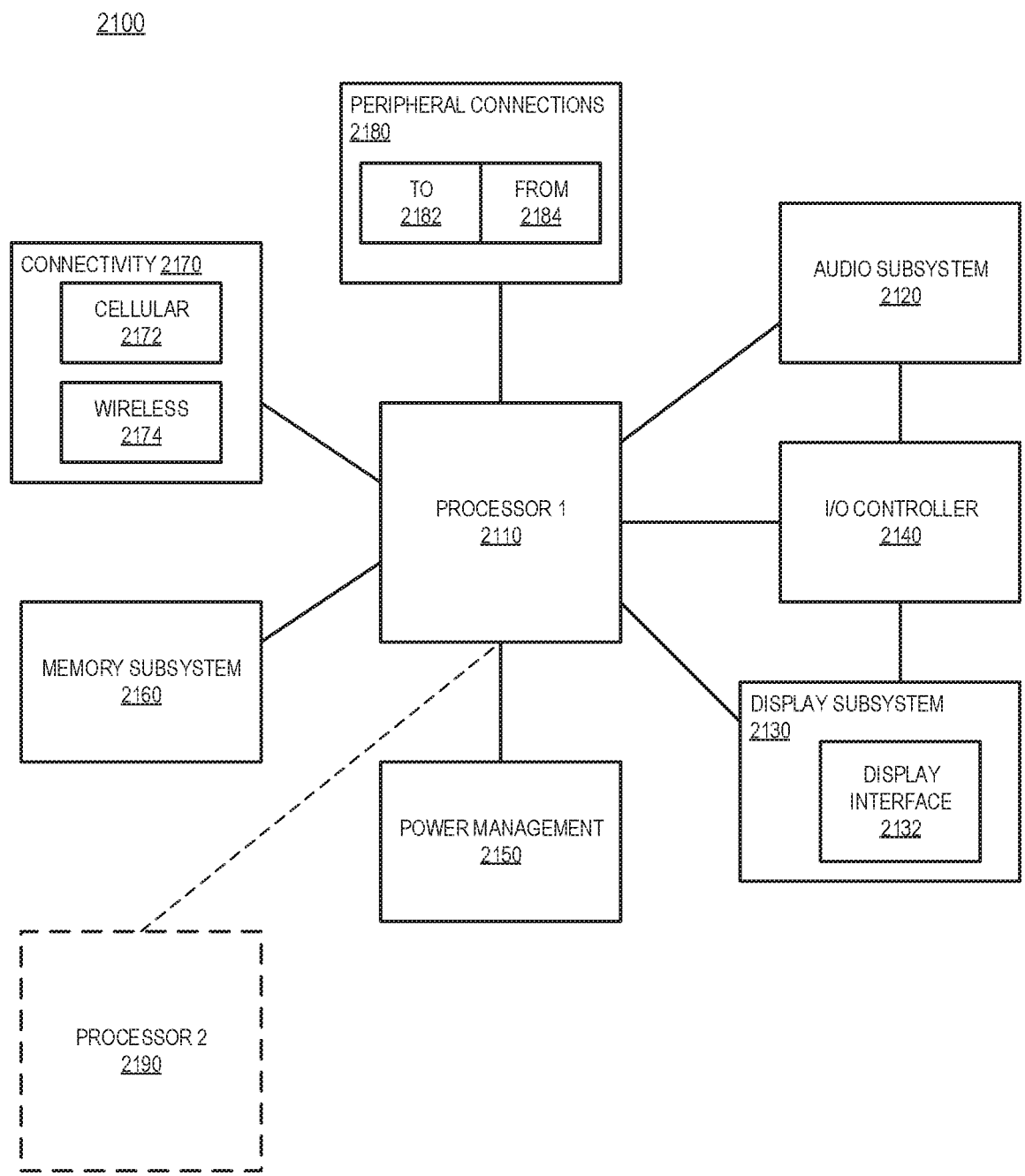
FIG. 12 illustrates a smart device or a computer system or a SoC (System-on-Chip) having dynamic-VT FETs, according to some embodiments.

FIG. 12 illustrates a smart device or a computer system or a SoC (System-on-Chip) having dynamic-VT FETs, according to some embodiments. It is pointed out that those elements of FIG. 12 having the same reference numbers (or names) as the elements of any other figure can operate or function in any manner similar to that described, but are not limited to such.

FIG. 12 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 having dynamic-VT FETs, according to some embodiments discussed. Other blocks of the computing device 2100 may also include dynamic-VT FETs of some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a transistor including: a layer of ferroelectric material; a layer of insulating material; and an oxide layer or a metal layer sandwiched between the layer of ferroelectric material and the layer of insulating material, wherein thickness of the ferroelectric material is less than thickness of the layer of insulating material; and a driver coupled to the transistor. In some embodiments, the transistor comprises a metal layer forming a gate terminal over the layer of insulating material. In some embodiments, the driver is coupled to the gate terminal of the transistor.

In some embodiments, the transistor has a threshold voltage which depends on whether a DC voltage or a switching voltage is applied to the gate terminal. In some embodiments, when the driver drives a DC voltage on the gate terminal, the threshold voltage increases, and when the driver drives a switching voltage on the gate terminal, the threshold voltage decreases. In some embodiments, the apparatus comprises: a channel region formed under the layer of ferroelectric material; and source and drain regions coupled on either sides of the channel region.

In some embodiments, proximity of the oxide layer or the metal layer relative to the channel region is such that there is asymmetry in time for the transistor to shift to lower threshold voltage and higher threshold voltage. In some embodiments, the oxide layer is formed of $Al_2O_3$. In some embodiments, the metal layer is formed of one of: Ti or W.

In another example, a system is provided which comprises: a memory; a processor coupled to the memory, the processor including an apparatus according to the apparatus described above; and a wireless interface for allowing the processor to communicate with another device.

In another example, an apparatus is provided which comprises: a transistor including: a first oxide layer of High-K material; a second oxide layer; and a layer of nanocrystals sandwiched between the first and second oxide layers, wherein thickness of first oxide layer is greater than thickness of the second oxide layer; and a driver coupled to the transistor. In some embodiments, the apparatus comprises: a channel region formed under the second oxide layer; and source and drain regions coupled on either sides of the channel region.

In some embodiments, the proximity of the layer of nanocrystals to the second oxide layer relative to the first oxide layer is such that there is asymmetry in time that it takes the transistor to shift to lower threshold voltage and higher threshold voltage. In some embodiments, the apparatus comprises: a metal layer forming a gate terminal over the first oxide layer. In some embodiments, the driver is coupled to the gate terminal of the transistor. In some embodiments, the transistor has a threshold voltage which depends on whether a DC voltage or a switching voltage is applied to the gate terminal. In some embodiments, when the driver drives a DC voltage on the gate terminal, the threshold voltage increases, and when the driver drives a switching voltage on the gate terminal, the threshold voltage decreases. In some embodiments, the layer of nanocrystals is formed of silicon nitride.

In another example, a system is provided which comprises: a memory; a processor coupled to the memory, the processor including an apparatus according to the apparatus described above; and a wireless interface for allowing the processor to communicate with another device.

In another example, a method is provided which comprises: forming a transistor by: depositing a layer of ferroelectric material; depositing a layer of insulating material; and depositing an oxide layer or a metal layer which is between the layer of ferroelectric material and the layer of insulating material, wherein thickness of the ferroelectric material is less than thickness of the layer of insulating material; and coupling a driver to the transistor. In some embodiments, the method comprises: depositing a metal layer to form a gate terminal over the layer of insulating material.

In some embodiments, the method comprises: coupling the driver to the gate terminal. In some embodiments, the transistor has a threshold voltage which depends on whether a DC voltage or a switching voltage is applied to the gate terminal. In some embodiments, the method comprises: driving, by the driver, a DC voltage on the gate terminal, the threshold voltage increases, and when the driver drives a switching voltage on the gate terminal, the threshold voltage decreases.

In some embodiments, the method comprises: forming a channel region under the layer of ferroelectric material; and forming source and drain regions coupled on either sides of the channel region. In some embodiments, proximity of the oxide layer or the metal layer relative to the channel region is such that there is asymmetry in time for the transistor to shift to lower threshold voltage and higher threshold voltage. In some embodiments, the oxide layer is formed of $Al_2O_3$. In some embodiments, the metal layer is formed of one of: Ti or W.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a transistor including:
   a first layer comprising a ferroelectric material;
   a second layer comprising an insulative material; and
   a third layer comprising a metal or oxygen, wherein the third layer is between the first layer and the second layer, and wherein a thickness of the ferroelectric material is less than an thickness of the insulative material; and
   a driver coupled to the transistor.

2. The apparatus of claim 1, wherein the transistor comprises a fourth layer comprising metal, and wherein the fourth layer forms a gate terminal over the second layer.

3. The apparatus of claim 2, wherein the driver is coupled to the gate terminal of the transistor.

4. The apparatus of claim 3, wherein the transistor has a threshold voltage which depends on whether a DC voltage or a switching voltage is applied to the gate terminal.

5. The apparatus of claim 2, wherein when the driver is to drive a DC voltage on the gate terminal, the threshold voltage increases, and when the driver is to drive a switching voltage on the gate terminal, the threshold voltage decreases.

6. The apparatus of claim 1 comprises:
   a semiconductor body under the first layer; and
   source and drain regions coupled on either sides of the semiconductor body.

7. The apparatus of claim 6, wherein proximity of the third layer relative to the semiconductor body is such that there is asymmetry in time for the transistor to shift to lower threshold voltage and higher threshold voltage.

8. The apparatus of claim 1, wherein the third layer comprises Al and O.

9. The apparatus of claim 1, wherein the third layer comprises one of: Ti or W.

10. An apparatus comprising:
    a transistor including:
    a first layer comprising a High-K material;
    a second layer comprising oxygen; and
    a third layer comprising nanocrystals, wherein the third layer is between the first and second layers, and wherein a thickness of first layer is greater than thickness of the second layer; and
    a driver coupled to the transistor.

11. The apparatus of claim 10 comprises:
    a semiconductor body under the second layer; and
    source and drain regions coupled on either sides of the semiconductor body.

12. The apparatus of claim 10, wherein a proximity of the third layer to the second layer relative to the first layer is such that there is asymmetry in time that takes the transistor to shift to lower threshold voltage and higher threshold voltage.

13. The apparatus of claim 10 comprises a fourth layer comprising metal, wherein the fourth layer forms a gate terminal over the first layer.

14. The apparatus of claim 13 wherein the driver is coupled to the gate terminal of the transistor.

15. The apparatus of claim 14, wherein the transistor has a threshold voltage which depends on whether a DC voltage or a switching voltage is applied to the gate terminal.

16. The apparatus of claim 14, wherein when the driver is to drive a DC voltage on the gate terminal, the threshold voltage increases, and when the driver is to drive a switching voltage on the gate terminal, the threshold voltage decreases.

17. The apparatus of claim 10, wherein the third layer comprises: Si and N.

18. A system comprises:
    a memory;
    a processor coupled to the memory, the processor including an apparatus which comprises:
    a transistor including:
    a first layer comprising a ferroelectric material;
    a second layer comprising an insulative material; and
    a third layer comprising a metal or oxygen, wherein the third layer is between the first layer and the second layer, and wherein a thickness of the ferroelectric material is less than an thickness of the insulative material;
    a driver coupled to the transistor; and
    a wireless interface to allow the processor to communicate with another device.

19. The system of claim 18, wherein the transistor comprises a fourth layer comprising metal, and wherein the fourth layer forms a gate terminal over the layer of insulative material.

20. The system of claim 18, wherein the third layer comprises Al and O, or wherein the third layer comprises one of: Ti or W.

* * * * *